United States Patent
Hsu et al.

(10) Patent No.: US 12,372,870 B2
(45) Date of Patent: Jul. 29, 2025

(54) PHOTOSENSITIVE RESIN COMPOSITION, OPTICAL FILM, AND METHOD OF PRODUCING THE SAME

(71) Applicant: eChem Solutions Corp., Taoyuan (TW)

(72) Inventors: Jui-Yu Hsu, Taoyuan (TW); Chia-Hao Lou, Taoyuan (TW); Chen-Wen Chiu, Taoyuan (TW)

(73) Assignee: eChem Solutions Corp., Taoyuan (TW)

( * ) Notice: Subject to any disclaimer, the term of this patent is extended or adjusted under 35 U.S.C. 154(b) by 303 days.

(21) Appl. No.: 17/938,944

(22) Filed: Sep. 7, 2022

(65) Prior Publication Data

US 2023/0099041 A1    Mar. 30, 2023

(30) Foreign Application Priority Data

Sep. 13, 2021   (TW) ................... 110133978

(51) Int. Cl.
    *G03F 7/075*     (2006.01)
    *G03F 7/00*      (2006.01)

(52) U.S. Cl.
    CPC .......... *G03F 7/0757* (2013.01); *G03F 7/0005* (2013.01)

(58) Field of Classification Search
    CPC ..................... G03F 7/0757; G03F 7/0005
    See application file for complete search history.

(56) References Cited

U.S. PATENT DOCUMENTS

| | | | | |
|---|---|---|---|---|
| 2018/0312707 A1* | 11/2018 | Wang | ..................... | B33Y 80/00 |
| 2020/0225581 A1* | 7/2020 | Hsu | ..................... | G02B 1/04 |

FOREIGN PATENT DOCUMENTS

| | | |
|---|---|---|
| CN | 107459871 | 12/2017 |
| CN | 107250198 | 2/2020 |
| JP | 2011202127 | 10/2011 |
| JP | 2011202127 A | * 10/2011 |
| JP | 2015071741 | 4/2015 |
| TW | 200838950 | 10/2008 |
| TW | 201431964 | 8/2014 |
| TW | 202028368 | 8/2020 |

OTHER PUBLICATIONS

JP-2011202127-A English translation from JPlatPat (Year: 2011).*
"Office Action of Taiwan Counterpart Application", issued on Jan. 11, 2023, p. 1-p. 11.

* cited by examiner

*Primary Examiner* — Alicia J Weydemeyer
*Assistant Examiner* — Laura B Figg
(74) *Attorney, Agent, or Firm* — JCIPRNET

(57) ABSTRACT

A photosensitive resin composition, an optical film and a method of producing the same are provided. The photosensitive resin composition includes a thiol compound (A) having two or more groups represented by formula (I-a), a polyether-modified polysiloxane (B), an ethylenically unsaturated group-containing compound (C) having one or two aromatic rings, a bisphenol fluorene oligomer (D) having one or two (meth)acryloyl groups, and a photoinitiator (E).

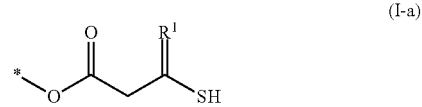

(I-a)

20 Claims, No Drawings

PHOTOSENSITIVE RESIN COMPOSITION, OPTICAL FILM, AND METHOD OF PRODUCING THE SAME

CROSS-REFERENCE TO RELATED APPLICATION

This application claims the priority benefit of Taiwanese application serial no. 110133978, filed on Sep. 13, 2021. The entirety of the above-mentioned patent application is hereby incorporated by reference herein and made a part of this specification.

BACKGROUND

Technical Field

The disclosure relates to a resin composition, a film and a method of producing the same, particularly to a photosensitive resin composition, an optical film and a method of producing the same.

Related Art

Recently, the application of a photosensitive composition for a thick film has become increasingly widespread. Application examples include a touch mobile device, a fingerprint recognition system, and wafer packaging. In a general photosensitive composition for a thick film, a solvent is often added, thus making it difficult to achieve a film thickness of about 20 to 120 μm on a substrate. Moreover, when the film thickness is large, phenomena such as low transmittance and high warpage are likely to occur.

The optical requirements imposed on a fingerprint recognition system are particularly stringent. A relatively thick optical film is required as a spacer, and the optical film is also required to have high transmittance for both infrared light and visible light. However, in order to achieve high transmittance for both infrared light and visible light at a large film thickness (for example, 120 μm), there may be a number of technical features to be achieved. For example, the substrate may warp due to the large film thickness, a satisfactory film thickness may be difficult to achieve due to the viscosity of photosensitive resin solution, surface coating may become uneven, or cracks may occur in the optical film after curing.

In addition to the above difficulties in achieving a large film thickness, another technical stringency may occur when the optical film is subjected to a reliability test. For example, high transmittance and low warpage need to be maintained under a high temperature storage test (at 125° C. for 1000 hours) and a high temperature and high humidity storage test (at 85° C. and 85% relative humidity (RH) for 1000 hours).

Therefore, how to provide a photosensitive resin composition that can be formed into an optical film having satisfactory optical and mechanical properties and capable of passing a reliability test at a film thickness of 20 to 120 μm may be an issue for those skilled in the art.

SUMMARY

The disclosure provides a photosensitive resin composition that can be formed into an optical film having high transmittance and low warpage and capable of passing a reliability test at a film thickness of 20 to 120 μm.

An embodiment of the disclosure provides a photosensitive resin composition including:

a thiol compound (A) having two or more groups represented by formula (I-a),

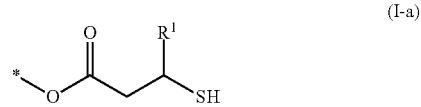

(I-a)

in which in formula (I-a), $R^1$ represents a hydrogen atom or a methyl group, and * represents a bonding position;

a polyether-modified polysiloxane (B);

an ethylenically unsaturated group-containing compound (C) having one or two aromatic rings;

a bisphenol fluorene oligomer (D) having one or two (meth)acryloyl groups; and a photoinitiator (E).

In an embodiment of the disclosure, based on 100 parts by weight of the ethylenically unsaturated group-containing compound (C), the content of the thiol compound (A) is 7 to 90 parts by weight.

In an embodiment of the disclosure, the thiol compound (A) includes at least one selected from the group consisting of a compound represented by formula (I-1), a compound represented by formula (I-2), a compound represented by formula (I-3), and a compound represented by formula (I-4).

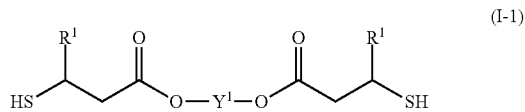

(I-1)

In formula (I-1), $R^1$ represents a hydrogen atom or a methyl group, and $Y^1$ represents an alkylene having 1 to 15 carbon atoms.

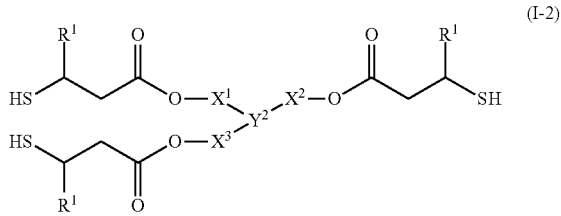

(I-2)

In formula (I-2), $R^1$ represents a hydrogen atom or a methyl group, $X^1$ to $X^3$ each independently represent a single bond or an alkylene having 1 to 5 carbon atoms, and $Y^2$ represents a trivalent hydrocarbon group having 1 to 15 carbon atoms or a group represented by formula (I-2-a).

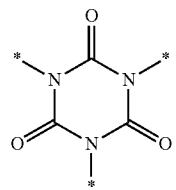

(I-2-a)

In formula (I-2-a), * represents a bonding position.

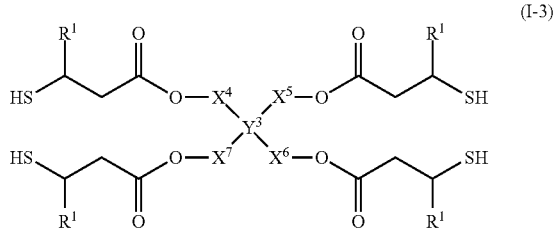

(I-3)

In formula (I-3), $R^1$ represents a hydrogen atom or a methyl group, $X^4$ to $X^7$ each independently represent a single bond or an alkylene having 1 to 5 carbon atoms, and $Y^3$ represents a tetravalent hydrocarbon group having 1 to 15 carbon atoms.

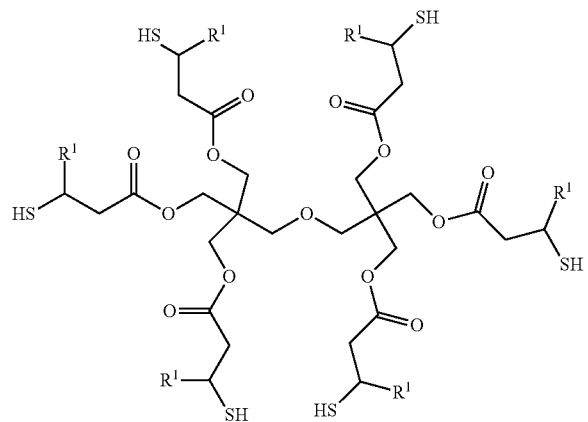

(I-4)

In formula (I-4), $R^1$ represents a hydrogen atom or a methyl group.

In an embodiment of the disclosure, the compound represented by formula (I-2) includes a compound represented by formula (I-2-1), a compound represented by formula (I-2-2), or a combination thereof,

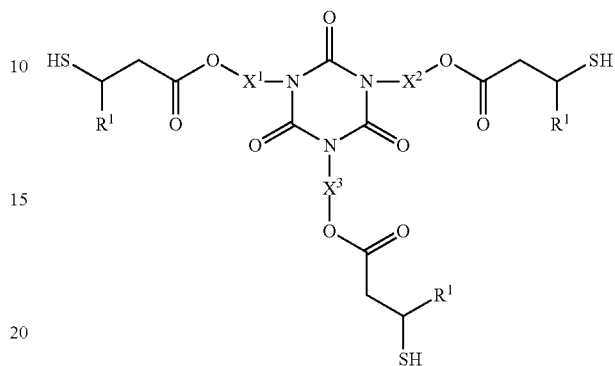

(I-2-1)

In formula (I-2-1), $R^1$ represents a hydrogen atom or a methyl group, and $X^1$ to $X^3$ each independently represent an alkylene having 1 to 5 carbon atoms.

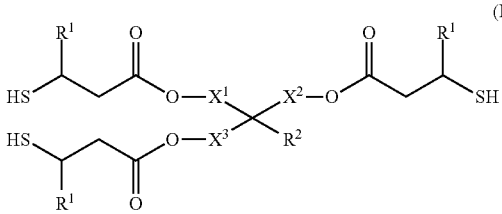

(I-2-2)

In formula (I-2-2), $R^1$ represents a hydrogen atom or a methyl group, $R^2$ represents an alkyl group having 1 to 14 carbon atoms, and $X^1$ to $X^3$ each independently represent an alkylene having 1 to 5 carbon atoms.

In an embodiment of the disclosure, based on 100 parts by weight of the ethylenically unsaturated group-containing compound (C), the content of the polyether-modified polysiloxane (B) is 0.01 to 0.5 part by weight.

In an embodiment of the disclosure, the polyether-modified polysiloxane (B) includes a dialkylsiloxane structure and a polyoxyalkylene structure.

In an embodiment of the disclosure, the polyether-modified polysiloxane (B) is a dimethylsiloxane-ethyleneoxy block copolymer.

In an embodiment of the disclosure, the ethylenically unsaturated group-containing compound (C) includes at least one selected from the group consisting of compounds represented by formula (1) to formula (14).

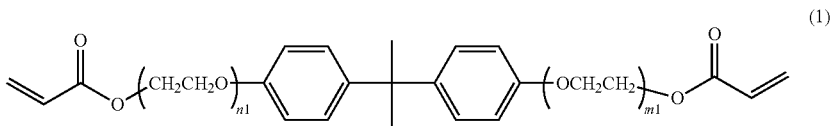

(1)

In formula (1), n1 and m1 each independently represent an integer of 0 to 20, and a sum of n1 and m1 is an integer of 1 to 20.

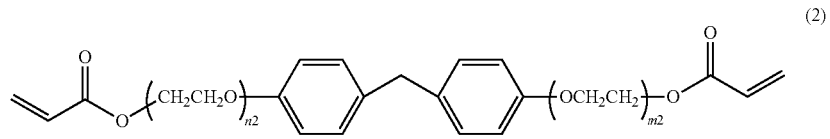
(2)

In formula (2), n2 and m2 each independently represent an integer of 0 to 4, and a sum of n2 and m2 is an integer of 2 to 4.

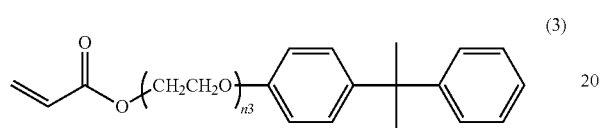
(3)

In formula (3), n3 represents an integer of 0 to 3.

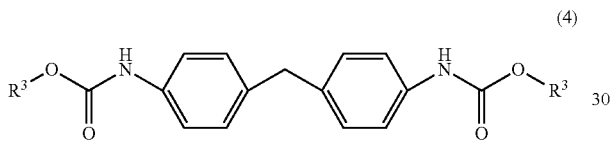
(4)

In formula (4), $R^3$ represents an alkyl group having 1 to 20 carbon atoms.

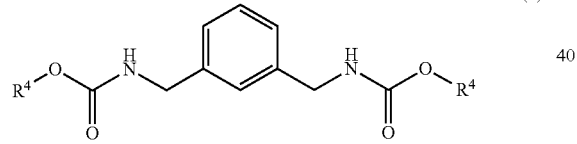
(5)

In formula (5), $R^4$ represents an alkyl group having 1 to 20 carbon atoms.

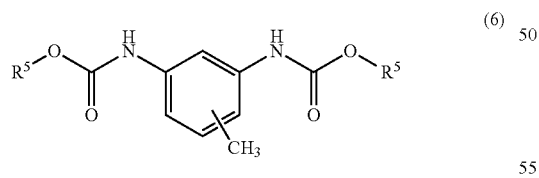
(6)

In formula (6), $R^5$ represents an alkyl group having 1 to 20 carbon atoms.

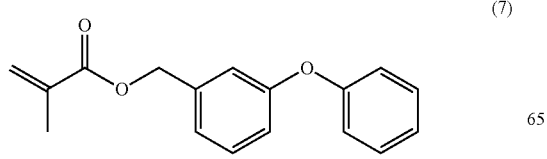
(7)

-continued

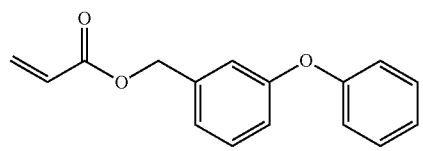
(8)

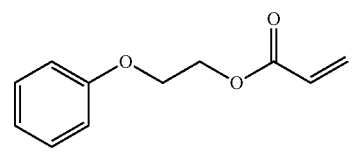
(9)

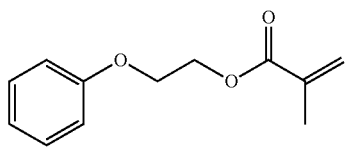
(10)

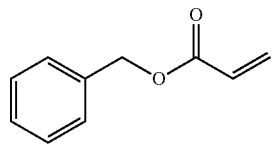
(11)

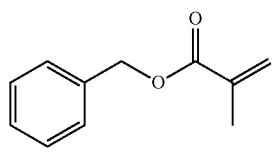
(12)

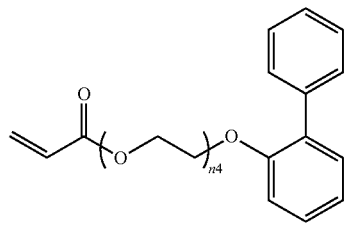
(13)

In formula (13), n4 represents an integer of 1 to 3.

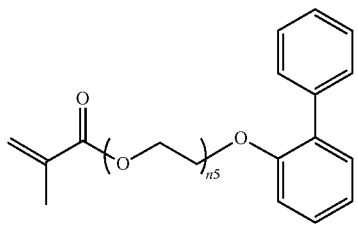

(14)

In formula (14), n5 represents an integer of 1 to 3.

In an embodiment of the disclosure, the ethylenically unsaturated group-containing compound (C) is a compound represented by formula (1).

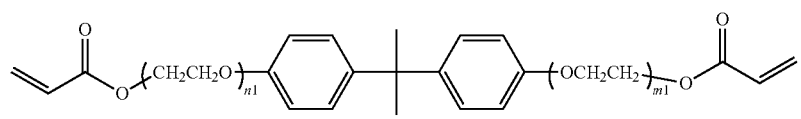

(1)

In formula (1), n1 and m1 each independently represent an integer of 0 to 20, and a sum of n1 and m1 is an integer of 1 to 20.

In an embodiment of the disclosure, the bisphenol fluorene oligomer (D) has a weight average molecular weight of 500 to 5000.

In an embodiment of the disclosure, the photoinitiator (E) includes an acylphosphine oxide compound (E-1).

In an embodiment of the disclosure, the photosensitive resin composition further includes a solvent. The content of the solvent is 1% by weight or less of the photosensitive resin composition.

Another embodiment of the disclosure provides a method of producing an optical film. The method includes the following. The photosensitive resin composition as described above is coated on a substrate to form a coating film. The coating film is exposed. The exposed coating film is baked to form an optical film on the substrate.

In an embodiment of the disclosure, the exposing is performed at a wavelength of 200 to 500 nm.

In an embodiment of the disclosure, the baking is performed at a temperature of 130° C. to 280° C.

Still another embodiment of the disclosure provides an optical film prepared by the method of producing an optical film as described above.

In an embodiment of the disclosure, when the optical film has a thickness of 20 to 120 μm, the optical film has a transmittance of 90% or more for visible light having a wavelength of 380 to 780 nm.

In an embodiment of the disclosure, when the optical film has a thickness of 20 to 120 μm, the optical film has a transmittance of 90% or more for infrared light having a wavelength of 780 to 1100 nm.

In an embodiment of the disclosure, when the optical film has a thickness of 20 to 120 μm, the optical film has a warpage of less than 0.05 mm relative to the substrate.

In an embodiment of the disclosure, when the optical film has a thickness of 20 to 120 μm, the optical film has a transmittance of 90% or more for visible light having a wavelength of 380 to 780 nm after being subjected to a high temperature storage test. The high temperature storage test is conducted by leaving the optical film to stand at 125° C. for 1000 hours.

In an embodiment of the disclosure, when the optical film has a thickness of 20 to 120 μm, the optical film has a transmittance of 90% or more for infrared light having a wavelength of 780 to 1100 nm after being subjected to a high temperature storage test. The high temperature storage test is conducted by leaving the optical film to stand at 125° C. for 1000 hours.

In an embodiment of the disclosure, when the optical film has a thickness of 20 to 120 μm, the optical film has a warpage of less than 0.05 mm relative to the substrate after being subjected to a high temperature storage test. The high temperature storage test is conducted by leaving the optical film to stand at 125° C. for 1000 hours.

Based on the above, the photosensitive resin composition according to the disclosure includes the thiol compound (A) having a specific structure, the polyether-modified polysiloxane (B), the ethylenically unsaturated group-containing compound (C), the bisphenol fluorene oligomer (D) and the photoinitiator (E). Thereby, the photosensitive resin composition can be formed into an optical film having high transmittance and low warpage and capable of passing a reliability test at a film thickness of 20 to 120 μm. Accordingly, technical issues such as insufficient optical and mechanical properties and insufficient reliability of large-thickness optical films can be reduced.

DESCRIPTION OF EMBODIMENTS

<Photosensitive Resin Composition>

The present embodiment provides a photosensitive resin composition including a thiol compound (A), a polyether-modified polysiloxane (B), an ethylenically unsaturated group-containing compound (C), a bisphenol fluorene oligomer (D) and a photoinitiator (E). In addition, the photosensitive resin composition may further include an additive (F) as needed. The components of the photosensitive resin composition will be described below in detail.

In the present specification, "(meth)acrylic acid" may mean "acrylic acid" and/or "methacrylic acid"; "(meth)acrylate" may mean "acrylate" and/or "methacrylate"; and "(meth)acryloyl" may mean "acryloyl" and/or "methacryloyl".

Thiol Compound (A)

The thiol compound (A) has two or more groups represented by formula (I-a).

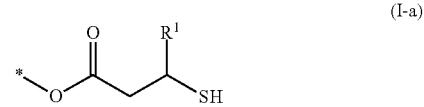

(I-a)

In formula (I-a), $R^1$ represents a hydrogen atom or a methyl group, and * represents a bonding position.

The thiol compound (A) is not particularly limited as long as it has two or more groups represented by formula (I-a). Specifically, the thiol compound (A) may include at least one selected from the group consisting of a compound represented by formula (I-1), a compound represented by formula (I-2), a compound represented by formula (I-3), and a compound represented by formula (I-4).

The compound represented by formula (I-1) is as follows:

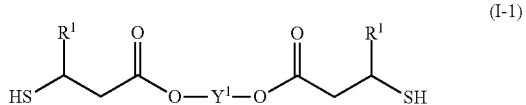

(I-1)

In formula (I-1), $R^1$ represents a hydrogen atom or a methyl group; and $Y^1$ represents an alkylene having 1 to 15 carbon atoms, and preferably represents an alkylene having 2 to 5 carbon atoms.

Specific examples of the compound represented by formula (I-1) include 1,4-bis(3-mercaptobutanoyloxy)butane.

The compound represented by formula (I-2) is as follows:

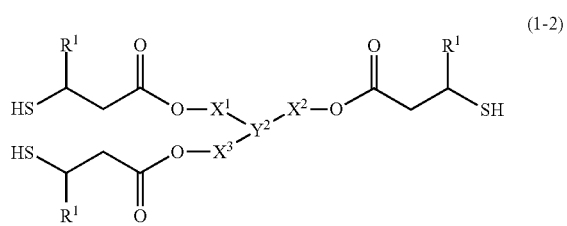

(I-2)

In formula (I-2), $R^1$ represents a hydrogen atom or a methyl group; $X^1$ to $X^3$ each independently represent a single bond or an alkylene having 1 to 5 carbon atoms, and preferably, each independently represent an alkylene having 1 to 3 carbon atoms; and $Y^2$ represents a trivalent hydrocarbon group having 1 to 15 carbon atoms or a group represented by formula (I-2-a), and preferably represents a trivalent hydrocarbon group having 2 to 5 carbon atoms or a group represented by formula (I-2-a).

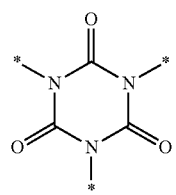

(I-2-a)

In formula (I-2-a), * represents a bonding position.

Specifically, the compound represented by formula (I-2) may include a compound represented by formula (I-2-1), a compound represented by formula (I-2-2), or a combination thereof.

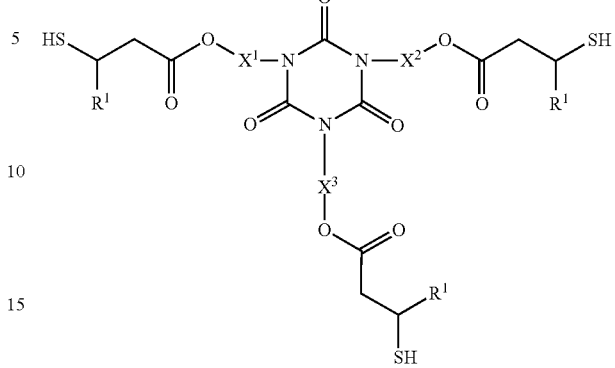

(I-2-1)

In formula (I-2-1), $R^1$ represents a hydrogen atom or a methyl group; and $X^1$ to $X^3$ each independently represent an alkylene having 1 to 5 carbon atoms, and preferably, each independently represent an alkylene having 1 to 3 carbon atoms.

Specific examples of the compound represented by formula (I-2-1) include 1,3,5-tris(3-mercaptobutanoyloxy-ethyl)-1,3,5-triazine-2,4,6(1H,3H,5H)-trione, tris-[(3-mercaptopropionyloxy)-ethyl]-isocyanurate, or a combination thereof.

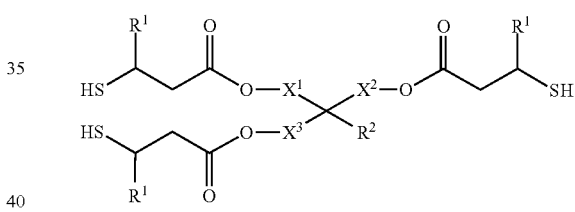

(I-2-2)

In formula (I-2-2), $R^1$ represents a hydrogen atom or a methyl group; $R^2$ represents an alkyl group having 1 to 14 carbon atoms; and $X^1$ to $X^3$ each independently represent an alkylene having 1 to 5 carbon atoms, and preferably, each independently represent an alkylene having 1 to 3 carbon atoms.

Specific examples of the compound represented by formula (I-2-2) include trimethylolpropane tris(3-mercaptopropionate), trimethylolethane tris(3-mercaptopropionate), or a combination thereof.

The compound represented by formula (I-3) is as follows:

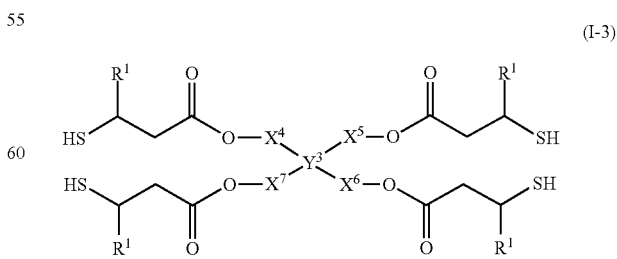

(I-3)

In formula (I-3), $R^1$ represents a hydrogen atom or a methyl group; $X^4$ to $X^7$ each independently represent a single bond or an alkylene having 1 to 5 carbon atoms, and preferably, each independently represent an alkylene having 1 carbon atom; and $Y^3$ represents a tetravalent hydrocarbon group having 1 to 15 carbon atoms, and preferably represents a tetravalent alkyl group having 1 carbon atom.

Specific examples of the compound represented by formula (I-3) include pentaerythritol tetrakis(3-mercaptobutyrate), pentaerythritol tetrakis(3-mercaptopropionate), or a combination thereof.

The compound represented by formula (I-4) is as follows:

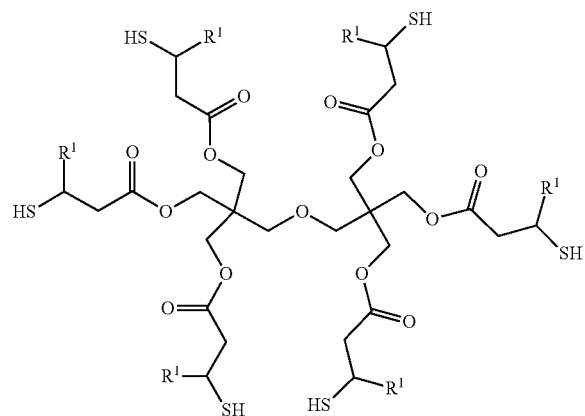

(I-4)

In formula (I-4), $R^1$ represents a hydrogen atom or a methyl group.

Specific examples of the compound represented by formula (I-4) include dipentaerythritol hexa(3-mercaptopropionate).

The thiol compound (A) is preferably pentaerythritol tetrakis(3-mercaptobutyrate).

Based on 100 parts by weight of the ethylenically unsaturated group-containing compound (C), the content of the thiol compound (A) may be 7 to 90 parts by weight, preferably 10 to 60 parts by weight, more preferably 10 to 40 parts by weight. When the content of the thiol compound (A) falls in the above range, high transmittance and low warpage may further be maintained under a high temperature storage test (at 125° C. for 1000 hours).

Polyether-modified Polysiloxane (B)

The polyether-modified polysiloxane (B) includes a dialkylsiloxane structure and a polyoxyalkylene structure.

In an embodiment, the polyether-modified polysiloxane (B) is, for example, a dimethylsiloxane-ethyleneoxy block copolymer.

Specifically, the polyether-modified polysiloxane (B) is, for example, a compound represented by formula (II-1):

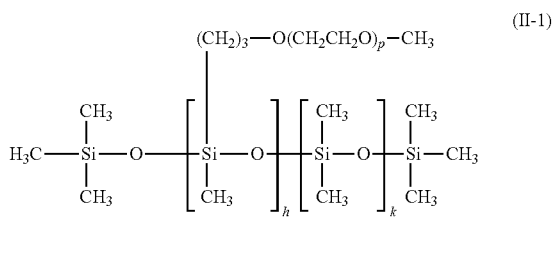

(II-1)

In formula (II-1), h represents an integer of 0 to 10, k represents an integer of 0 to 10, and p represents an integer of 0 to 10.

Specific examples of the polyether-modified polysiloxane (B) include TEGO® Wet 270 (made by Evonik), BYK-302 (made by BYK), BYK-333 (made by BYK), and TEGO® Wet 280 (made by Evonik).

Based on 100 parts by weight of the ethylenically unsaturated group-containing compound (C), the content of the polyether-modified polysiloxane (B) may be 0.01 to 0.5 part by weight, preferably 0.01 to 0.045 part by weight, more preferably 0.01 to 0.035 part by weight. When the content of the polyether-modified polysiloxane (B) falls in the above range, humps formed by accumulation at a wafer edge during coating may further be reduced.

Ethylenically Unsaturated Group-containing Compound (C)

The ethylenically unsaturated group-containing compound (C) has one or two aromatic rings. By introducing an aromatic ring into the ethylenically unsaturated group-containing compound (C), warpage of an optical film formed of the photosensitive resin composition can be reduced. When the ethylenically unsaturated group-containing compound (C) has more than two aromatic rings, the transmittance of the optical film decreases.

The ethylenically unsaturated group-containing compound (C) preferably has one or two (meth)acryloyl groups. In the present embodiment, since the ethylenically unsaturated group-containing compound (C) and the bisphenol fluorene oligomer (D) both have a (meth)acryloyl group, they have the matched reaction rate, and excessively fast partial curing can be prevented. Therefore, the transmittance of the optical film can be maintained.

Specifically, the ethylenically unsaturated group-containing compound (C) includes at least one selected from the group consisting of compounds represented by formula (1) to formula (14).

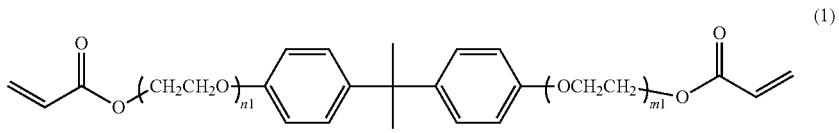

(1)

In formula (1), n1 and m1 each independently represent an integer of 0 to 20, and a sum of n1 and m1 is an integer of 1 to 20.

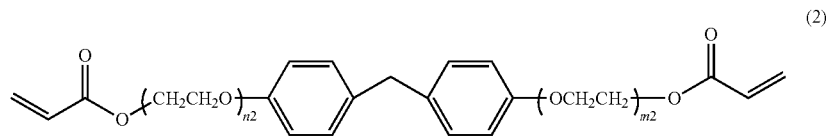
(2)

In formula (2), n2 and m2 each independently represent an integer of 0 to 4, and a sum of n2 and m2 is an integer of 2 to 4.

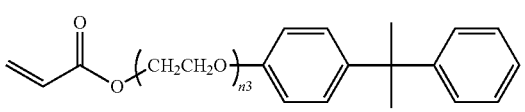
(3)

In formula (3), n3 represents an integer of 0 to 3.

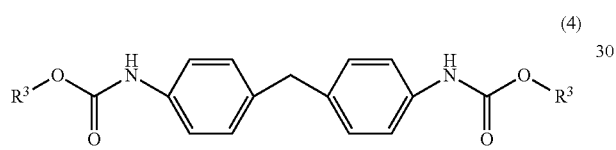
(4)

In formula (4), $R^3$ represents an alkyl group having 1 to 20 carbon atoms.

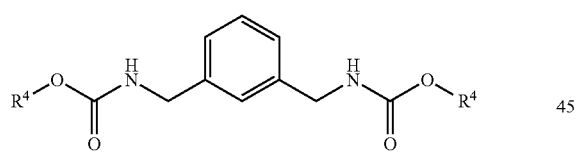
(5)

In formula (5), $R^4$ represents an alkyl group having 1 to 20 carbon atoms.

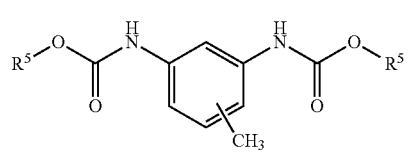
(6)

In formula (6), $R^5$ represents an alkyl group having 1 to 20 carbon atoms.

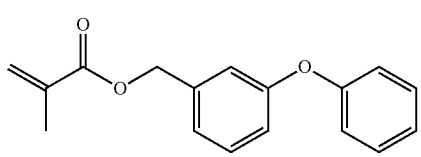
(7)

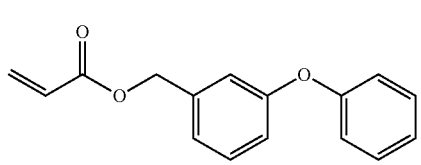
(8)

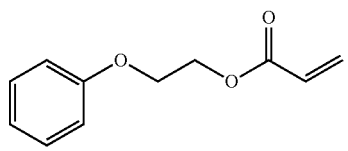
(9)

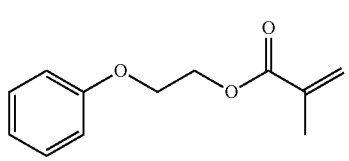
(10)

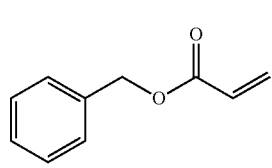
(11)

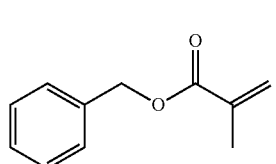
(12)

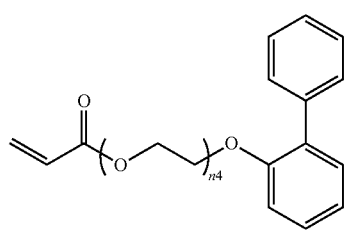
(13)

In formula (13), n4 represents an integer of 1 to 3.

(14)

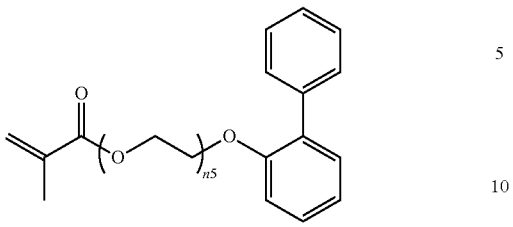

In formula (14), n5 represents an integer of 1 to 3.

In an embodiment, the ethylenically unsaturated group-containing compound (C) is a compound represented by formula (1).

(1)

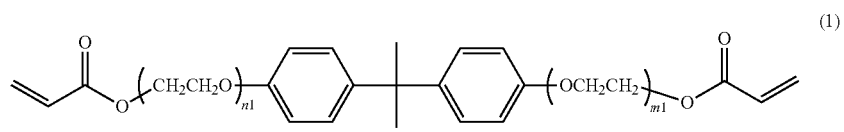

In formula (1), n1 and m1 each independently represent an integer of 0 to 20, and a sum of n1 and m1 is an integer of 1 to 20.

Specific examples of the compound represented by formula (1) include a compound represented by formula (I-1).

(1-1)

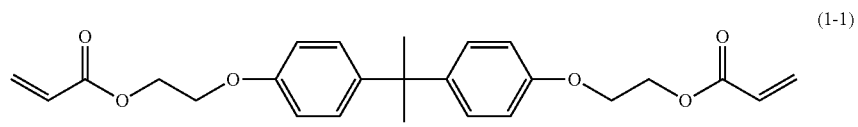 [SMILES: C=CC(=O)OCCOc1ccc(C(C)(C)c2ccc(OCCOC(=O)C=C)cc2)cc1]

Specific examples of the compound represented by formula (2) include a compound represented by formula (2-1).

(2-1)

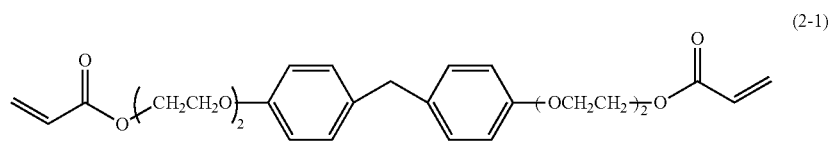

Specific examples of the compound represented by formula (3) include a compound represented by formula (3-1).

Specific examples of the compound represented by formula (4) include a compound represented by formula (4-1).

(3-1)

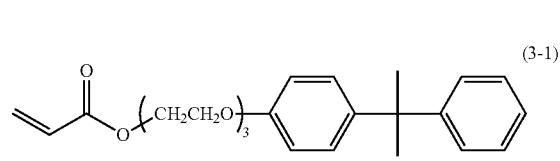

(4-1)

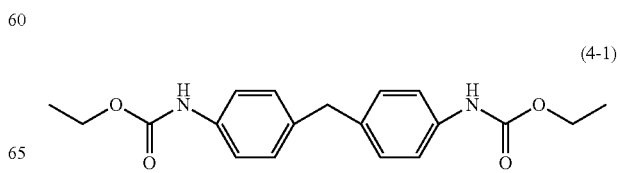

Specific examples of the compound represented by formula (5) include a compound represented by formula (5-1).

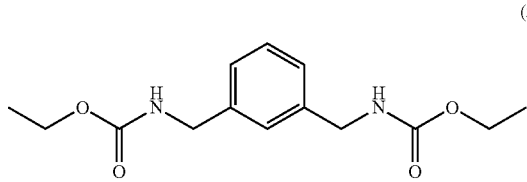

(5-1)

Specific examples of the compound represented by formula (6) include a compound represented by formula (6-1).

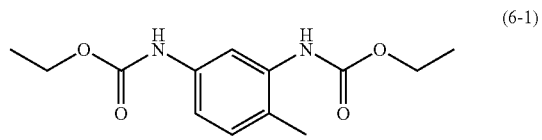 [SMILES: CCOC(=O)Nc1ccc(C)c(NC(=O)OCC)c1]

(6-1)

Specific examples of the compound represented by formula (13) include a compound represented by formula (13-1).

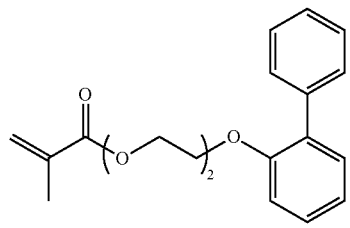

(13-1)

Specific examples of the compound represented by formula (14) include a compound represented by formula (14-1).

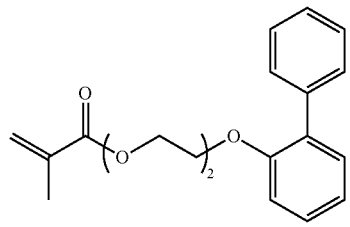

(14-1)

In an embodiment, the ethylenically unsaturated group-containing compound (C) includes the compound represented by formula (1). When the ethylenically unsaturated group-containing compound (C) includes the compound represented by formula (1), the transmittance of the optical film may further be increased. When the ethylenically unsaturated group-containing compound (C) is the compound represented by formula (1), the transmittance of the optical film may even further be increased.

Bisphenol Fluorene Oligomer (D)

The bisphenol fluorene oligomer (D) has one or two (meth)acryloyl groups. In the present embodiment, since the ethylenically unsaturated group-containing compound (C) and the bisphenol fluorene oligomer (D) both have a (meth)acryloyl group, they have the matched reaction rate, and excessively fast partial curing can be prevented. Therefore, the transmittance of the optical film can be maintained.

The bisphenol fluorene oligomer (D) is not particularly limited, and specific examples thereof may include MIRAMER HR6100 (modified bisphenol fluorene diacrylate), MIRAMER HR6042 (modified bisphenol fluorene diacrylate), MIRAMER HR6060 (modified bisphenol fluorene diacrylate) (all of which are made by Miwon Co., Ltd.), or a combination thereof.

In an embodiment, the bisphenol fluorene oligomer (D) has a weight average molecular weight of 500 to 5000. When the weight average molecular weight of the bisphenol fluorene oligomer (D) falls in the above range, the viscosity of the photosensitive resin composition can further be adjusted to a satisfactory range.

Based on 100 parts by weight of the ethylenically unsaturated group-containing compound (C), the content of the bisphenol fluorene oligomer (D) may be 5 to 400 parts by weight, preferably 15 to 280 parts by weight, more preferably 50 to 250 parts by weight. When the content of the bisphenol fluorene oligomer (D) falls in the above range, low warpage may further be maintained under a high temperature storage test (at 125° C. for 1000 hours).

Photoinitiator (E)

The photoinitiator (E) includes an acylphosphine oxide compound (E-1).

The acylphosphine oxide compound (E-1) is not particularly limited, and an appropriate acylphosphine oxide compound may be selected according to needs. Specific examples of the acylphosphine oxide compound (E-1) include diphenyl(2,4,6-trimethylbenzoyl)phosphine oxide (product name: TPO, made by BASF, compound represented by formula (III-1)), bis-(2,6-dimethoxybenzoyl)-2,4,4-trimethylbenzyl phosphine oxide, phenylbis(2,4,6-trimethylbenzoyl)phosphine oxide (product name: Irgacure® 819, made by BASF, compound represented by formula (III-2)), or a combination thereof.

Preferred specific examples of the acylphosphine oxide compound (E-1) include diphenyl(2,4,6-trimethylbenzoyl) phosphine oxide, phenylbis(2,4,6-trimethylbenzoyl)phosphine oxide, or a combination thereof. When the acylphosphine oxide compound (E-1) includes diphenyl(2,4,6-trimethylbenzoyl)phosphine oxide, phenylbis(2,4,6-trimethylbenzoyl)phosphine oxide, or a combination thereof, the reactivity of the photoinitiator can be fully exhibited.

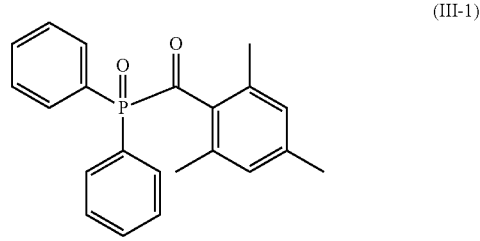

(III-1)

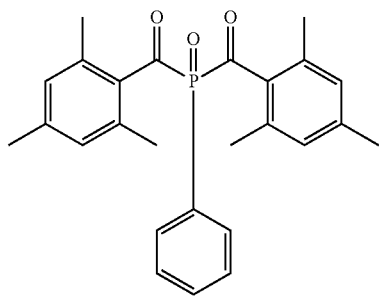

(III-2)

The present embodiment is not limited to the above, and the photoinitiator (E) may also include any other suitable photoinitiator. The photoinitiator (E) may further include an acetophenone-based compound, a phenyl ketone-based compound, a biimidazole-based compound, a benzophenone-based compound, an acyl oxime-based compound, α-diketone compounds, acyloin compounds, acyloinether compounds, quinone compounds, a halogen compound, a peroxide, a cationic compound, or a combination thereof.

Specific examples of the acetophenone-based compound include p-dimethylamino-acetophenone, α,α'-dimethoxyazoxy-acetophenone, 2,2'-dimethyl-2-phenyl-acetophenone, p-methoxy-acetophenone, 2-methyl-1-(4-methylthiophenyl)-2-morpholino-1-propanone, 2-benzyl-2-N,N-dimethylamino-1-(4-morpholinophenyl)-1-butanone, or a combination thereof.

Specific examples of the phenyl ketone-based compound include 1-hydroxycyclohexyl-phenyl-ketone (product name: Irgacure® 184, made by Ciba Specialty Chemicals), 2-hydroxy-2-methyl-1-phenyl-propane-1-one (product name: Darocur® 1173, made by Ciba Specialty Chemicals), 2-hydroxy-1-{4-[4-(2-hydroxy-2-methyl-propionyebenzyl]phenyl}-2-methyl-propane-1-one (product name: Irgacure® 127, made by Ciba Specialty Chemicals), or a combination thereof.

Specific examples of the biimidazole-based compound include 2,2'-bis(o-chlorophenyl)-4,4',5,5'-tetraphenyl-biimidazole, 2,2'-bis(o-fluorophenyl)-4,4',5,5'-tetraphenyl-biimidazole, 2,2'-bis(o-methyl phenyl)-4,4',5,5'-tetraphenyl-biimidazole, 2,2'-bis(o-methoxyphenyl)-4,4',5,5'-tetraphenyl-biimidazole, 2,2'-bis(o-ethylphenyl)-4,4',5,5'-tetraphenyl-biimidazole, 2,2'-bis(p-methoxyphenyl)-4,4',5,5'-tetraphenyl-biimidazole, 2,2'-bis(2,2',4,4'-tetramethoxyphenyl)-4,4',5,5'-tetraphenyl-biimidazole, 2,2'-bis(2-chlorophenyl)-4,4',5,5'-tetraphenyl-biimidazole, 2,2'-bis(2,4-dichlorophenyl)-4,4',5,5'-tetraphenyl-biimidazole, or a combination thereof.

Specific examples of the benzophenone-based compound include thioxanthone, 2,4-diethylthioxanthanone, thioxanthone-4-sulfone, benzophenone, 4,4'-bis(dimethylamino) benzophenone, 4,4'-bis(diethylamino)benzophenone, or a combination thereof.

Specific examples of the acyl oxime-based compound include ethanone,1-[9-ethyl-6-(2-methylbenzoyl)-9H-carbazole-3-yl]-,1-(O-acetyl oxime) (such as "CGI-242" made by Ciba Specialty Chemicals), 1-(4-phenyl-thio-phenyl)-octane-1,2-dion 2-oxime-O-benzoate (such as "CGI-124" made by Ciba Specialty Chemicals), ethanone, 1-[9-ethyl-6-(2-cholro-4-benzyl-thio-benzoyl)-9H-carbazole-3-yl]-,1-(O-acetyl oxime) (made by Asahi Denka Co., Ltd.), or a combination thereof.

Specific examples of the α-diketone compounds include benzil, acetyl, or a combination thereof.

Specific examples of the acyloin compounds include benzoin.

Specific examples of the acyloinether compounds include benzoin methyl ether, benzoin ethyl ether, benzoin isopropyl ether, or a combination thereof.

Specific examples of the quinone compounds include anthraquinone, 1,4-naphthoquinone, or a combination thereof.

Specific examples of the halogen compound include phenacyl chloride, tribromomethyl phenylsulfone, tris (trichloromethyl)-s-triazine, or a combination thereof.

Specific examples of the peroxide include di-tert-butylperoxide.

Specific examples of the cationic compound include diazonium salt, iodonium salt, sulfonium salt, or a combination thereof.

Based on 100 parts by weight of the ethylenically unsaturated group-containing compound (C), the content of the photoinitiator (E) may be 0.01 to 40 parts by weight, preferably 0.1 to 20 parts by weight, more preferably 0.5 to 10 parts by weight. When the content of the photoinitiator (E) falls in the above range, the reactivity of the photoinitiator can be fully exhibited.

Additive (F)

In addition to the above-mentioned components, the photosensitive resin composition of the present embodiment may optionally further include the additive (F) without affecting the effects of the present embodiment. The additive (F) is not particularly limited, and specific examples thereof may include a surfactant, a photosensitizer, an antioxidant, an ultraviolet absorber, a light stabilizer, an anti-aging agent, a plasticizer, an adhesion promoter, a thermal polymerization initiator, a photobase generator, a colorant, inorganic particles, elasticity body particles, a basic compound, a photoacid generator, a photoacid multiplier, a chain transfer agent, an antistatic agent, a flow regulator, a defoamer, a dispersant, or a combination thereof.

Based on 100 parts by weight of the ethylenically unsaturated group-containing compound (C), the content of the additive (F) may be 0.005 to 0.015 part by weight.

Solvent

The content of the solvent is 1% by weight or less of the photosensitive resin composition without affecting the effects of the present embodiment.

The solvent is not particularly limited. For example, a solvent may be used which is able to dissolve, without reacting with, the thiol compound (A), the polyether-modified polysiloxane (B), the ethylenically unsaturated group-containing compound (C), the bisphenol fluorene oligomer (D), the photoinitiator (E) and the additive (F).

Specific examples of the solvent include ethylene glycol monoalkyl ethers, ethylene glycol dialkyl ethers, ethylene glycol monoalkyl ether acetates, propylene glycol monoalkyl ethers, propylene glycol dialkyl ethers, propylene glycol monoalkyl ether acetates, diethylene glycol dialkyl ethers (such as diethylene glycol diethyl ether and diethylene glycol methyl ethyl ether), diethylene glycol monoalkyl ether acetates, dipropylene glycol monoalkyl ethers, dipropylene glycol dialkyl ethers, dipropylene glycol monoalkyl ether acetates, esters, ketones, amides, and lactones. Preferred specific examples of the solvent include propylene glycol monomethyl ether acetate, diethylene glycol ethyl methyl ether, γ-butyrolactone, N-methylpyrrolidone, 1,3-butanediol diacetate, or a combination thereof.

When the content of the solvent is 1% by weight or less of the photosensitive resin composition, an optical film having a film thickness of 20 to 120 μm can be formed. Moreover, the likelihood of bubbles being formed in the optical film is reduced and good optical properties are achieved. In the case where the content of the solvent is more than 1% by weight of the photosensitive resin composition, when the photosensitive resin composition is intended to be formed into a coating of a thick film (having a thickness of 50 μm or more), the solvent may volatilize and bubbles are likely to form in the coating.

In another embodiment, the photosensitive resin composition substantially includes no solvent. Accordingly, when the photosensitive resin composition is formed into a coating of a thick film (having a thickness of 50 μm or more), the situation where the solvent volatilizes and bubbles form in the coating is avoided, and the optical properties are improved.

<Method of Preparing Photosensitive Resin Composition>

A method of preparing a photosensitive resin composition of the present embodiment is not particularly limited, and a method of appropriately mixing various components may be selected according to needs. For example, the thiol compound (A), the polyether-modified polysiloxane (B), the ethylenically unsaturated group-containing compound (C), the bisphenol fluorene oligomer (D) and the photoinitiator (E) may be put into a stirrer and stirred to be uniformly mixed into a solution. The additive (F) may be added as needed. After the components are uniformly mixed, a photosensitive resin composition can be obtained.

<Method of Producing Optical Film>

The present embodiment provides a method of producing an optical film including the following. The photosensitive resin composition as described above is coated on a substrate to form a coating film. The coating film is exposed. The exposed coating film is baked to form an optical film on the substrate.

It is worth noting that during the exposure, the thiol compound (A), the polyether-modified polysiloxane (B), the ethylenically unsaturated group-containing compound (C) and the bisphenol fluorene oligomer (D) contained in the photosensitive resin composition undergo crosslinking reaction with each other and are cured into the optical film.

The photosensitive resin composition may be coated on the substrate using a spin coater, a spinless coating machine, or a slit-die coating machine. Preferably, a spin coater is used. In the case of the spin coater, a rotation speed is 800 to 3500 rpm, and the thus formed coating film has a thickness of 20 to 120 μm.

Specific examples of the substrate include a glass substrate, a sapphire substrate, or a silicon wafer substrate.

Energy of the exposure is 9600 J/m². A device that performs the exposure is not particularly limited, and is, for example, a high-pressure mercury lamp, an ultra-high-pressure mercury lamp or a metal halide lamp.

The baking temperature may be 200° C. to 220° C. The baking time may be 20 to 60 minutes. In an embodiment, the baking temperature may be 220° C., and the baking time may be 20 minutes.

In an embodiment, when the optical film has a thickness of 20 to 120 μm, the optical film has a transmittance of 90% or more for visible light having a wavelength of 380 to 780 nm.

In an embodiment, when the optical film has a thickness of 20 to 120 μm, the optical film has a transmittance of 90% or more for infrared light having a wavelength of 780 to 1100 nm.

In an embodiment, when the optical film has a thickness of 20 to 120 μm, the optical film has a warpage of less than 0.05 mm relative to the substrate.

In an embodiment, when the optical film has a thickness of 20 to 120 μm, the optical film has a transmittance of 90% or more for visible light having a wavelength of 380 to 780 nm after being subjected to a high temperature storage test.

In an embodiment, when the optical film has a thickness of 20 to 120 μm, the optical film has a transmittance of 90% or more for infrared light having a wavelength of 780 to 1100 nm after being subjected to a high temperature storage test.

In an embodiment, when the optical film has a thickness of 20 to 120 μm, the optical film has a warpage of less than 0.05 mm relative to the substrate after being subjected to a high temperature storage test.

The so-called high temperature storage test is conducted by leaving the optical film to stand at 125° C. for 1000 hours.

The disclosure will be described below in detail with reference to experimental examples. The following experimental examples are provided to describe the disclosure. Moreover, the scope of the disclosure includes the scope of the appended claims as well as alternatives and modifications thereof, and is not limited to the scope of the experiments.

EXPERIMENTAL EXAMPLES AND COMPARATIVE EXAMPLES OF PHOTOSENSITIVE RESIN COMPOSITION AND OPTICAL FILM

Described below are Experimental Examples 1 to 3 and Comparative Examples 1 to 3 of the photosensitive resin composition and the optical film.

Experiment Example 1 a. Photosensitive Resin Composition 75.03 parts by weight of a thiol compound, 0.05 part by weight of a polyether-modified polysiloxane, 100.0 parts by weight of an ethylenically unsaturated group-containing compound, 325.1 parts by weight of a bisphenol fluorene oligomer, 6.82 parts by weight of a photoinitiator 1 and 1.68 parts by weight of a photoinitiator 2 were mixed together, followed by being uniformly stirred with a stirrer to obtain a photosensitive resin composition of Experimental Example 1.

b. Optical Film

Various photosensitive resin compositions prepared in the experimental examples were coated on a silicon wafer substrate by spin coating using a spin coater (model: MK-VIII, made by Tokyo Electron Limited (TEL), at a rotation speed of 1000 rpm). Next, exposure was performed with UV light with an energy of 9600 J/m² (model of the exposure machine: 5500iZa, made by Canon) to obtain a semi-finished product. Next, baking was performed at 220° C. for 20 minutes to obtain an optical film. The thus obtained semi-finished product and optical film were evaluated as follows, and the results are shown in Table 1.

Experimental Examples 2 to 3 and Comparative Examples 1 to 3

The photosensitive resin compositions of Experimental Examples 2 to 3 and Comparative Examples 1 to 3 were prepared in the same manner as in Experimental Example 1, except that the types of the components of the photosensitive resin composition and amounts thereof used were changed (as shown in Table 1). The thus obtained photosensitive resin compositions were evaluated as follows, and the results are shown in Table 1.

TABLE 1

|  | Component | Experimental Example 1 | Experimental Example 2 | Experimental Example 3 | Comparative Example 1 | Comparative Example 2 | Comparative Example 3 |
|---|---|---|---|---|---|---|---|
|  | Thiol compound (A) | 75.03 | 8.233 | 24.99 | — | 6.171 | 75.37 |
|  | Polyether-modified polysiloxane (B) | 0.05 | 0.01 | 0.03 | — | 0.03 | 0.51 |
|  | Ethylenically unsaturated group-containing compound (C) | 100.0 | 100.0 | 100.0 | 100.0 | 100.0 | 100.0 |
|  | Bisphenol fluorene oligomer (D) | 325.1 | 9.42 | 125.0 | 178.7 | 197.2 | 326.6 |
|  | Photoinitiator 1 (E-1) | 6.82 | 1.60 | 3.41 | 3.80 | 4.13 | 6.85 |
|  | Photoinitiator 2 (E-2) | 1.68 | 0.39 | 0.84 | 0.94 | 1.02 | 1.69 |
| Results of Evaluation | Film thickness | ⊚ | ⊚ | ⊚ | ⊚ | ⊚ | ⊚ |
|  | Warpage | ⊚ | ⊚ | ⊚ | ⊚ | ⊚ | ⊚ |
|  | Visible light transmittance | ⊚ | ⊚ | ⊚ | ⊚ | ⊚ | ⊚ |
|  | Infrared transmittance | ⊚ | ⊚ | ⊚ | ⊚ | ⊚ | ⊚ |
|  | Recoatability | ⊚ | ⊚ | ⊚ | ⊚ | ⊚ | X |
|  | Humps | ⊚ | ⊚ | ⊚ | X | ⊚ | X |
|  | Reliability test for visible light transmittance | ⊚ | ⊚ | ⊚ | X | X | ⊚ |
|  | Reliability test for infrared transmittance | ⊚ | ⊚ | ⊚ | X | X | ⊚ |
|  | Reliability test for warpage | ⊚ | ⊚ | ⊚ | X | X | ⊚ |

The compounds used in each component in Table 1 are shown in Table 2 below.

TABLE 2

| Component | Compound used |
|---|---|
| Thiol compound (A) | Pentaerythritol-based tetrafunctional thiol ester structure with four HS-CH$_2$-CH$_2$-C(=O)-O- groups attached to a central quaternary carbon (with ethyl substituent shown) |
| Polyether-modified polysiloxane (B) | $H_3C-Si(CH_3)_2-O-[Si(CH_3)(R)-O]_h-[Si(CH_3)_2-O]_k-Si(CH_3)_3$, where $R = (CH_2)_3-O(CH_2CH_2O)_p-CH_3$; $p + h + k = 4$ to $15$ |
| Ethylenically unsaturated group-containing compound (C) | Bisphenol-based diacrylate: $CH_2=CH-C(=O)-O-(CH_2CH_2O)_2-C_6H_4-C(CH_3)_2-C_6H_4-(OCH_2CH_2)_2-O-C(=O)-CH=CH_2$ |

TABLE 2-continued

| Component | Compound used |
|---|---|
| Bisphenol fluorene oligomer (D) | 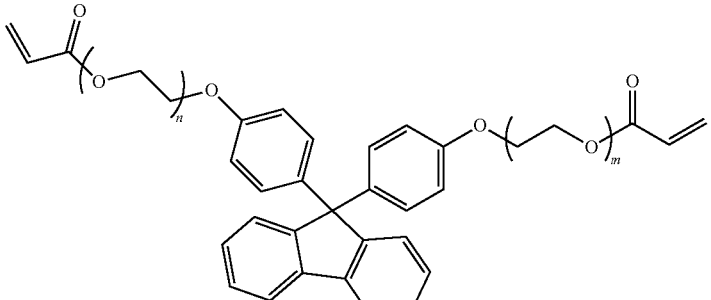<br>m + n = 2 to 10 |
| Photoinitiator 1 (E-1) | 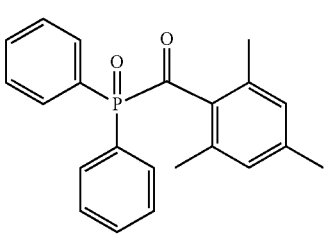 [SMILES: Cc1cc(C)c(C(=O)P(=O)(c2ccccc2)c2ccccc2)c(C)c1] |
| Photoinitiator 2 (E-2) | 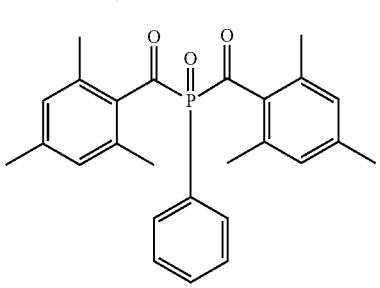 |

<Evaluation Methods> a. Film Thickness

The film thickness of a finished optical film was measured with an optical film thickness meter (model: VM-1210; made by Dainippon Seiki Co., Ltd.).

⊚: film thickness was 20 to 120 μm;
×: film thickness was less than 20 μm.

b. Warpage

A feeler gauge (model: 25410015, made by Phoenix Electronics, Germany) was inserted into an edge of a substrate, and the thickness of a gap between the edge of the substrate and a plane was measured as warpage. The warpage was evaluated in the following manner.

⊚: warpage was less than 0.05 mm;
Δ: warpage was greater than or equal to 0.05 mm and less than 1.0 mm;
×: warpage was greater than or equal to 1.0 mm.

c. Visible Light Transmittance

The transmittance of an optical film at a wavelength of 380 to 780 nm was measured with an ultraviolet-visible spectrometer (model: U2900, made by Hitachi, Ltd.).

⊚: transmittance was greater than or equal to 90%;
Δ: transmittance was greater than or equal to 80% and less than 90%;
×: transmittance was less than 80%.

d. Infrared Transmittance

The transmittance of an optical film at a wavelength of 780 to 1100 nm was measured with an ultraviolet-visible spectrometer (model: U2900, made by Hitachi, Ltd.).

⊚: transmittance was greater than or equal to 90%;
Δ: transmittance was greater than or equal to 80% and less than 90%;
×: transmittance was less than 80%.

e. Recoatability

An ink mark of about 100 mm was produced on an optical film by brushing with an ACCU DYNE Test™ marker pen, and whether 90% or more of the ink mark shrank and formed ink droplets within 2 seconds. A dyne level was determined when no more shrinkage was observed.

⊚: surface tension was greater than or equal to 38 dyn/cm;
×: surface tension was less than 38 dyn/cm.

f. Humps

The film thickness of a semi-finished optical film at an edge thereof in a width range of 10 mm was measured with an optical film thickness meter (model: VM-1210; made by Dainippon Seiki Co., Ltd.), and a width range in which the film thickness of the edge suddenly increased was calculated.

⊚: hump width was less than 5 mm;
×: hump width was greater than or equal to 5 mm.

g. Reliability Test for Visible Light Transmittance

After production of an optical film was completed, the optical film was subjected to a high temperature storage test (at 125° C. for 1000 hours), and then measured for transmittance at a wavelength of 380 to 780 nm with an ultraviolet-visible spectrometer (model: U2900, made by Hitachi, Ltd.).

◎: transmittance was greater than or equal to 90%;
Δ: transmittance was greater than or equal to 80% and less than 90%;
×: transmittance was less than 80%.

h. Reliability Test for Infrared Transmittance

After production of an optical film was completed, the optical film was subjected to a high temperature storage test (at 125° C. for 1000 hours), and then measured for transmittance at a wavelength of 780 to 1100 nm with an ultraviolet-visible spectrometer (model: U2900, made by Hitachi, Ltd.).

◎: transmittance was greater than or equal to 90%;
Δ: transmittance was greater than or equal to 80% and less than 90%;
×: transmittance was less than 80%.

i. Reliability Test for Warpage

After production of an optical film was completed, the optical film was subjected to a high temperature storage test (at 125° C. for 1000 hours). Then, a feeler gauge (model: 25410015, made by Phoenix Electronics, Germany) was inserted into an edge of a substrate, and the thickness of a gap between the edge of the substrate and a plane of a platform on which the substrate was placed was measured as warpage. The warpage was evaluated in the following manner.

◎: warpage was less than 0.05 mm;
Δ: warpage was greater than or equal to 0.05 mm and less than 1.0 mm;
×: warpage was greater than or equal to 1.0 mm.

<Results of Evaluation>

As is clear from Table 1, when a photosensitive resin composition includes at the same time the thiol compound (A) having two or more groups represented by formula (I-a), the polyether-modified polysiloxane (B), the ethylenically unsaturated group-containing compound (C), the bisphenol fluorene oligomer (D) and the photoinitiator (E) (see Experimental Examples 1 to 3), the photosensitive resin composition can be formed into an optical film having a film thickness of 20 to 120 μm. Further, in each of the optical films of Experimental Examples 1 to 3, the warpage, visible light transmittance and infrared transmittance were all evaluated as "◎", and the visible light transmittance, infrared transmittance and warpage after the high temperature storage test were all evaluated as "◎" as well. Thus, the optical films formed of the photosensitive resin compositions of Experimental Examples 1 to 3 demonstrated high transmittance and low warpage and passed the reliability test at a film thickness of 20 to 120 μm.

On the other hand, when a photosensitive resin composition does not include the thiol compound (A) and the polyether-modified polysiloxane (B) (see Comparative Example 1), the visible light transmittance, infrared transmittance and warpage of the photosensitive resin composition after the high temperature storage test were all evaluated as "×". Thus, the optical film formed of the photosensitive resin composition of Comparative Example 1 demonstrated insufficient reliability.

When a photosensitive resin composition does not include a sufficient amount of the thiol compound (A) (see Comparative Example 2), the visible light transmittance, infrared transmittance and warpage of the photosensitive resin composition after the high temperature storage test were all evaluated as "×". Thus, the optical film formed of the photosensitive resin composition of Comparative Example 2 demonstrated insufficient reliability.

When an excessive amount of the polyether-modified polysiloxane (B) is added to the photosensitive resin composition (see Comparative Example 3), the recoatability (that is, ability to allow coating of a next photoresist on a film surface of the photosensitive resin composition) and the humps (that is, hill-like raised parts formed by accumulating the photosensitive resin composition at a wafer edge, expressed by the width of the humps) of the photosensitive resin composition were both evaluated as "×". Thus, the optical film formed of the photosensitive resin composition of Comparative Example 3 demonstrated poor coating properties.

In summary, the photosensitive resin composition according to the disclosure includes the thiol compound (A) having a specific structure, the polyether-modified polysiloxane (B), the ethylenically unsaturated group-containing compound (C), the bisphenol fluorene oligomer (D) and the photoinitiator (E). Thereby, the photosensitive resin composition can be formed into an optical film having high transmittance and low warpage and capable of passing a reliability test at a film thickness of 20 to 120 μm. Thus, the photosensitive resin composition may be applied in an optical element. Accordingly, phenomena such as insufficient optical and mechanical properties and insufficient reliability of large-thickness optical films can be reduced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A photosensitive resin composition, comprising:
a thiol compound (A) having two or more groups represented by formula (I-a),

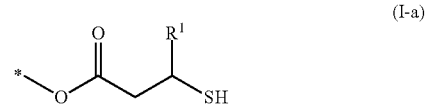

wherein in formula (I-a), $R^1$ represents a hydrogen atom or a methyl group, and * represents a bonding position;
a polyether-modified polysiloxane (B);
an ethylenically unsaturated group-containing compound (C) having one or two aromatic rings;
a bisphenol fluorene oligomer (D) having one or two (meth) acryloyl groups; and
a photoinitiator (E),
wherein based on 100 parts by weight of the ethylenically unsaturated group-containing compound (C), a content of the thiol compound (A) is 7 to 90 parts by weight, a content of the polyether-modified polysiloxane (B) is 0.01 to 0.05 part by weight, a content of the bisphenol fluorene oligomer (D) is 5 to 400 parts by weight, and a content of the photoinitiator (E) is 0.01 to 40 parts by weight.

2. The photosensitive resin composition according to claim 1, wherein the thiol compound (A) comprises at least one selected from the group consisting of a compound represented by formula (I-1), a compound represented by formula (I-2), a compound represented by formula (I-3), and a compound represented by formula (I-4),

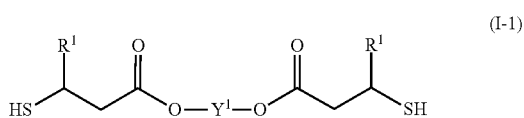
(I-1)

wherein in formula (I-1), $R^1$ represents a hydrogen atom or a methyl group, and $Y^1$ represents an alkylene having 1 to 15 carbon atoms,

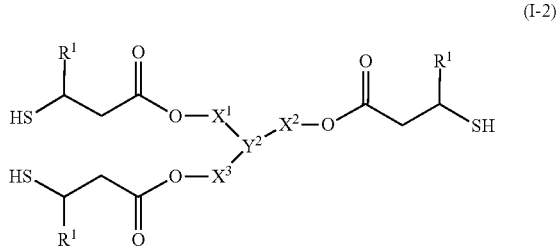
(I-2)

in formula (I-2), $R^1$ represents a hydrogen atom or a methyl group, $X^1$ to $X^3$ each independently represent a single bond or an alkylene having 1 to 5 carbon atoms, and $Y^2$ represents a trivalent hydrocarbon group having 1 to 15 carbon atoms or a group represented by formula (I-2-a),

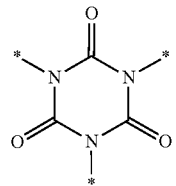
(I-2-a)

wherein in formula (I-2-a), * represents a bonding position,

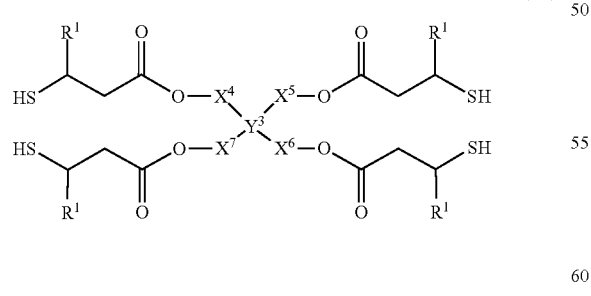
(I-3)

in formula (I-3), $R^1$ represents a hydrogen atom or a methyl group, $X^4$ to $X^7$ each independently represent a single bond or an alkylene having 1 to 5 carbon atoms, and $Y^3$ represents a tetravalent hydrocarbon group having 1 to 15 carbon atoms,

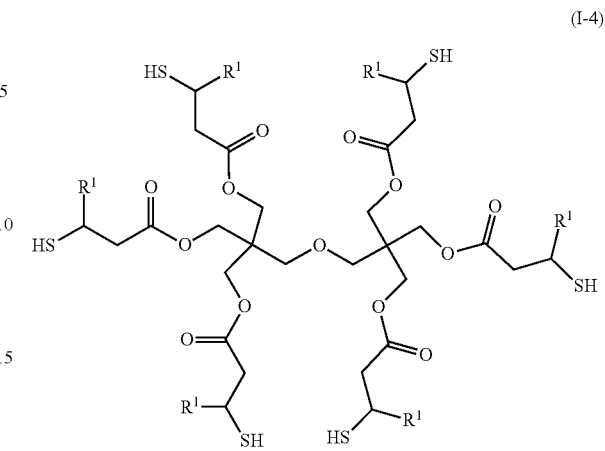
(I-4)

in formula (I-4), $R^1$ represents a hydrogen atom or a methyl group.

3. The photosensitive resin composition according to claim 2, wherein the compound represented by formula (I-2) comprises a compound represented by formula (I-2-1), a compound represented by formula (I-2-2), or a combination thereof,

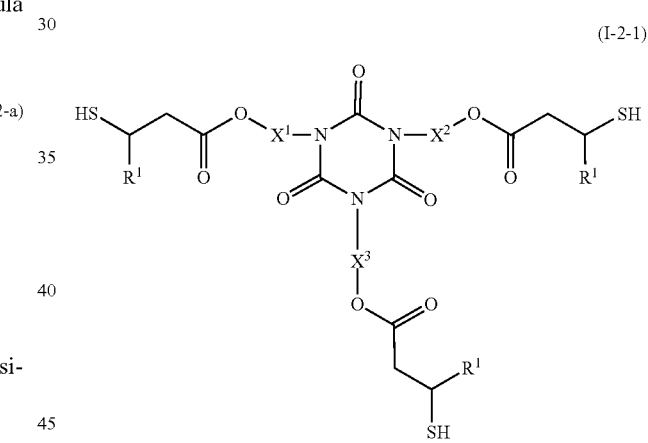
(I-2-1)

wherein in formula (I-2-1), $R^1$ represents a hydrogen atom or a methyl group, and $X^1$ to $X^3$ each independently represent an alkylene having 1 to 5 carbon atoms,

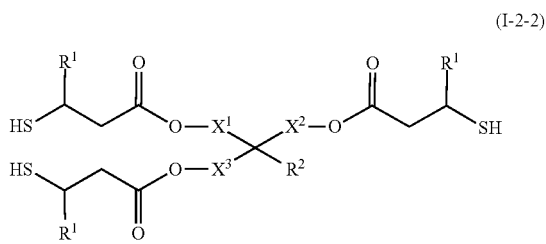
(I-2-2)

in formula (I-2-2), $R^1$ represents a hydrogen atom or a methyl group, $R^2$ represents an alkyl group having 1 to 14 carbon atoms, and $X^1$ to $X^3$ each independently represent an alkylene having 1 to 5 carbon atoms.

4. The photosensitive resin composition according to claim 1, wherein the polyether-modified polysiloxane (B) comprises a dialkylsiloxane structure and a polyoxyalkylene structure.

5. The photosensitive resin composition according to claim 1, wherein the polyether-modified polysiloxane (B) is a dimethylsiloxane-ethyleneoxy block copolymer.

6. The photosensitive resin composition according to claim 1, wherein the ethylenically unsaturated group-containing compound (C) comprises at least one selected from the group consisting of compounds represented by formula (1) to formula (14),

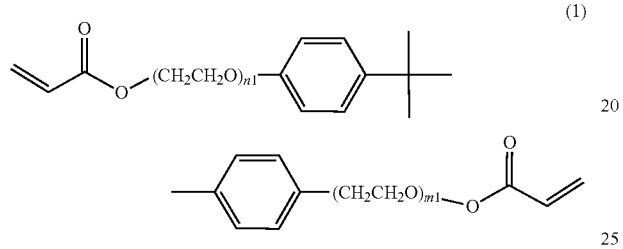
(1)

wherein in formula (1), n1 and m1 each independently represent an integer of 0 to 20, and a sum of n1 and m1 is an integer of 1 to 20,

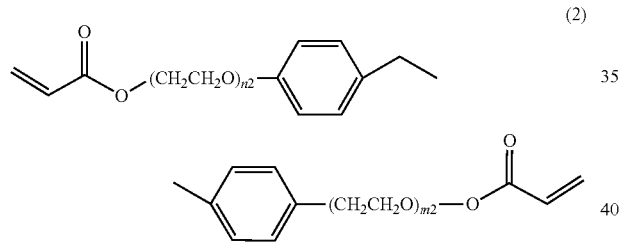
(2)

in formula (2), n2 and m2 each independently represent an integer of 0 to 4, and a sum of n2 and m2 is an integer of 2 to 4,

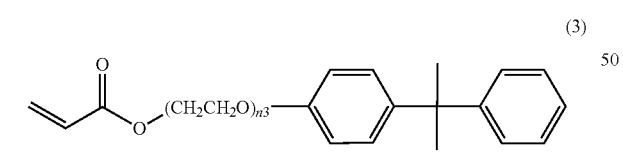
(3)

in formula (3), n3 represents an integer of 0 to 3,

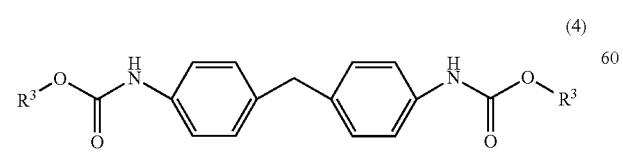
(4)

in formula (4), $R^3$ represents an alkyl group having 1 to 20 carbon atoms,

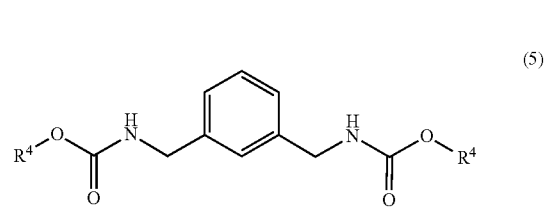
(5)

in formula (5), $R^4$ represents an alkyl group having 1 to 20 carbon atoms,

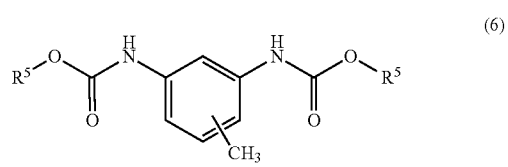
(6)

in formula (6), $R^5$ represents an alkyl group having 1 to 20 carbon atoms, (7)

(8)

(9)

(10)

(11)

(12)

-continued

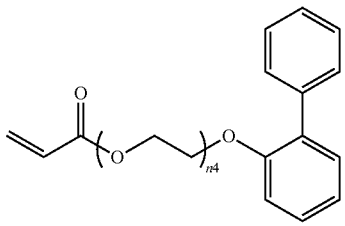
(13)

in formula (13), n4 represents an integer of 1 to 3,

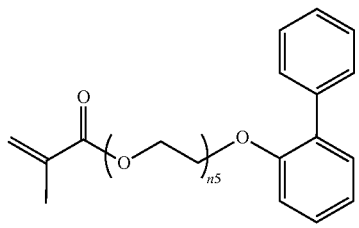
(14)

in formula (14), n5 represents an integer of 1 to 3.

7. The photosensitive resin composition according to claim 1, wherein the ethylenically unsaturated group-containing compound (C) is a compound represented by formula (1),

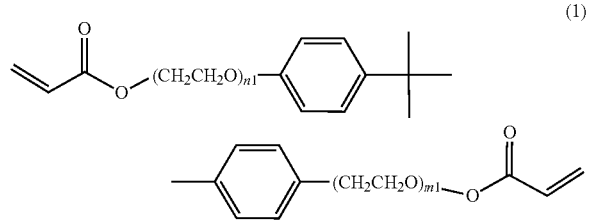
(1)

wherein in formula (1), n1 and m1 each independently represent an integer of 0 to 20, and a sum of n1 and m1 is an integer of 1 to 20.

8. The photosensitive resin composition according to claim 1, wherein the bisphenol fluorene oligomer (D) has a weight average molecular weight of 500 to 5000.

9. The photosensitive resin composition according to claim 1, wherein the photoinitiator (E) comprises an acylphosphine oxide compound (E-1).

10. The photosensitive resin composition according to claim 1, further comprising a solvent, wherein a content of the solvent is 1% by weight or less of the photosensitive resin composition.

11. A method of producing an optical film, comprising:
coating the photosensitive resin composition according to claim 1 on a substrate to form a coating film;
exposing the coating film; and
baking the exposed coating film to form an optical film on the substrate.

12. The method of producing an optical film according to claim 11, wherein the exposing is performed at a wavelength of 200 to 500 nm.

13. The method of producing an optical film according to claim 11, wherein the baking is performed at a temperature of 130° C. to 280° C.

14. An optical film, prepared by the method of producing an optical film according to claim 11.

15. The optical film according to claim 14, wherein when the optical film has a thickness of 20 to 120 μm, the optical film has a transmittance of 90% or more for visible light having a wavelength of 380 to 780 nm.

16. The optical film according to claim 14, wherein when the optical film has a thickness of 20 to 120 μm, the optical film has a transmittance of 90% or more for infrared light having a wavelength of 780 to 1100 nm.

17. The optical film according to claim 14, wherein when the optical film has a thickness of 20 to 120 μm, the optical film has a warpage of less than 0.05 mm relative to the substrate.

18. The optical film according to claim 14, wherein when the optical film has a thickness of 20 to 120 μm, the optical film has a transmittance of 90% or more for visible light having a wavelength of 380 to 780 nm after being subjected to a high temperature storage test, wherein the high temperature storage test is conducted by leaving the optical film to stand at 125° C. for 1000 hours.

19. The optical film according to claim 14, wherein when the optical film has a thickness of 20 to 120 μm, the optical film has a transmittance of 90% or more for infrared light having a wavelength of 780 to 1100 nm after being subjected to a high temperature storage test, wherein the high temperature storage test is conducted by leaving the optical film to stand at 125° C. for 1000 hours.

20. The optical film according to claim 14, wherein when the optical film has a thickness of 20 to 120 μm, the optical film has a warpage of less than 0.05 mm relative to the substrate after being subjected to a high temperature storage test, wherein the high temperature storage test is conducted by leaving the optical film to stand at 125° C. for 1000 hours.

* * * * *